(12) United States Patent
Lee et al.

(10) Patent No.: US 10,734,968 B2
(45) Date of Patent: Aug. 4, 2020

(54) BULK ACOUSTIC RESONATOR AND FILTER INCLUDING THE SAME

(71) Applicant: Samsung Electro-Mechanics Co., Ltd., Suwon-si (KR)

(72) Inventors: Tae Kyung Lee, Suwon-si (KR); Tae Yoon Kim, Suwon-si (KR); Dae Ho Kim, Suwon-si (KR); Chang Hyun Lim, Suwon-si (KR); Tae Hun Lee, Suwon-si (KR); Sang Kee Yoon, Suwon-si (KR); Jong Woon Kim, Suwon-si (KR); Won Han, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 43 days.

(21) Appl. No.: 15/647,660

(22) Filed: Jul. 12, 2017

(65) Prior Publication Data

US 2018/0062608 A1 Mar. 1, 2018

(30) Foreign Application Priority Data

Aug. 26, 2016 (KR) .................. 10-2016-0109377
Mar. 23, 2017 (KR) .................. 10-2017-0036660

(51) Int. Cl.
*H03H 9/02* (2006.01)
*H03H 9/56* (2006.01)
(Continued)

(52) U.S. Cl.
CPC ....... *H03H 9/02015* (2013.01); *H01L 41/047* (2013.01); *H03H 3/02* (2013.01);
(Continued)

(58) Field of Classification Search
CPC .......... H03H 9/02015; H03H 9/02062; H03H 9/02118; H03H 9/02157; H03H 9/173;
(Continued)

(56) References Cited

U.S. PATENT DOCUMENTS

2005/0140247 A1* 6/2005 Lee .......................... H03H 3/04
310/320
2006/0170520 A1 8/2006 Ha et al.
(Continued)

FOREIGN PATENT DOCUMENTS

JP 2009-55128 A 3/2009
KR 10-2005-0066104 A 6/2005
(Continued)

OTHER PUBLICATIONS

Korean Office Action dated May 20, 2019 in counterpart Korean Patent Application No. 10-2017-0036660 (6 pages in English and 5 pages in Korean).

*Primary Examiner* — Samuel S Outten
(74) *Attorney, Agent, or Firm* — NSIP Law

(57) ABSTRACT

A bulk acoustic resonator includes: a substrate including an upper surface on which a substrate protection layer is disposed; and a membrane layer forming a cavity together with the substrate, wherein a thickness deviation of either one or both of the substrate protection layer and the membrane layer is 170 Å or less.

17 Claims, 14 Drawing Sheets

(51) Int. Cl.
  *H03H 3/02* (2006.01)
  *H03H 9/17* (2006.01)
  *H03H 9/60* (2006.01)
  *H01L 41/047* (2006.01)
  *H03H 9/54* (2006.01)

(52) U.S. Cl.
  CPC .... *H03H 9/02062* (2013.01); *H03H 9/02118* (2013.01); *H03H 9/02157* (2013.01); *H03H 9/173* (2013.01); *H03H 9/547* (2013.01); *H03H 9/562* (2013.01); *H03H 9/568* (2013.01); *H03H 9/605* (2013.01); *H03H 9/542* (2013.01); *H03H 9/545* (2013.01); *H03H 2003/021* (2013.01)

(58) Field of Classification Search
  CPC ........ H03H 9/547; H03H 9/562; H03H 9/568; H03H 9/605; H01L 41/047
  USPC ......................................................... 333/189
  See application file for complete search history.

(56) References Cited

U.S. PATENT DOCUMENTS

| | | |
|---|---|---|
| 2008/0042780 A1 | 2/2008 | Lee et al. |
| 2008/0309432 A1* | 12/2008 | Fattinger .................. H03H 3/04 333/189 |
| 2011/0121915 A1* | 5/2011 | Miller ...................... H03H 3/04 333/187 |

FOREIGN PATENT DOCUMENTS

| | | |
|---|---|---|
| KR | 10-2006-0087848 A | 8/2006 |
| KR | 10-2008-0015632 A | 2/2008 |

\* cited by examiner

BULK ACOUSTIC RESONATOR AND FILTER INCLUDING THE SAME

CROSS-REFERENCE TO RELATED APPLICATIONS

This application claims benefit under 35 U.S.C. § 119(a) of Korean Patent Application Nos. 10-2016-0109377 and 10-2017-0036660 filed on Aug. 26, 2016 and Mar. 23, 2017, respectively, in the Korean Intellectual Property Office, the entire disclosures of which are incorporated herein by reference for all purposes.

BACKGROUND

1. Field

The following description relates to a bulk acoustic resonator and a filter including a bulk acoustic resonator.

2. Description of Related Art

Recently, in accordance with the rapid development of mobile communications devices, chemical devices, and biological devices, demand for a small and lightweight filter, an oscillator, a resonant element, and an acoustic resonant mass sensor used in such devices, has also increased.

A film bulk acoustic resonator (FBAR) has been known as a device to implement a small and lightweight filter, an oscillator, a resonant element, and an acoustic resonant mass sensor, as described above. The film bulk acoustic resonator has advantages in that the film bulk acoustic resonator may be cheaply mass-produced and implemented at a micro size. Further, the film bulk acoustic resonator has advantages in that a high quality factor Q, a main property of the filter, may be implemented, and the film bulk acoustic resonator may be used in a micro frequency band, in particular, in a personal communications system band and a digital cordless system band.

However, there may be a problem in that, as a size of the film bulk acoustic resonator is increased, performance of the film bulk acoustic resonator deteriorates.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator includes: a substrate including an upper surface on which a substrate protection layer is disposed; and a membrane layer forming a cavity together with the substrate, wherein a thickness deviation of either one or both of the substrate protection layer and the membrane layer is 170 Å or less.

Either one or both of the substrate protection layer and the membrane layer may include a dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer including any one or any combination of any two or more of aluminum (Al), nickel (Ni), chromium (Cr), platinum (Pt), gallium (Ga), and hafnium (Hf).

The membrane layer may include the dielectric layer, and the substrate protection layer may include either one of silicon nitride and silicon oxide.

The membrane layer may include the dielectric layer, and the membrane layer may include either one of silicon nitride and silicon oxide.

The bulk acoustic resonator may further include: a lower electrode disposed on the membrane layer; a piezoelectric layer configured to partially cover the lower electrode; and an upper electrode disposed on the piezoelectric layer.

The bulk acoustic resonator may further include: a passivation layer disposed on portions of the upper and lower electrodes; and a metal pad formed other portions of the upper and lower electrodes on which the passivation layer is not formed.

The upper electrode may include a frame portion disposed at an edge of an active region of the bulk acoustic resonator.

A ratio of half a width of the active region to a thickness deviation of either one or both of the substrate protection layer and the membrane layer may be greater than 0.0150 and less than 0.0200.

The cavity may be formed by removal of a sacrificial layer disposed on the substrate.

The sacrificial layer may include a silicon-based material, and may be removed by a halide-based etching gas.

In another general aspect, a bulk acoustic resonator includes: a substrate including an upper surface on which a substrate protection layer is formed; and a membrane layer forming a cavity together with the substrate, wherein either one or both of the substrate protection layer and the membrane layer include a dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer including any one or any combination of any two or more of aluminum (Al), nickel (Ni), chromium (Cr), platinum (Pt), gallium (Ga), and hafnium (Hf).

The bulk acoustic resonator may further include: a lower electrode disposed on the membrane layer; a piezoelectric layer configured to partially cover the lower electrode; and an upper electrode disposed on the piezoelectric layer.

The bulk acoustic resonator may further include: a passivation layer disposed on portions of the upper and lower electrodes; and a metal pad disposed on other portions of the upper and lower electrodes on which the passivation layer is not formed.

A thickness deviation of either one or both of the substrate protection layer and the membrane layer may be 170 Å or less.

The membrane layer may include the dielectric layer, and the substrate protection layer may include either one of silicon nitride and silicon oxide.

The substrate protection layer may include the dielectric layer, and the membrane layer may include either one of silicon nitride and silicon oxide.

The cavity may be formed by removing a sacrificial layer disposed on the substrate. The sacrificial layer may include a silicon-based material, and may be removed by a halide-based etching gas.

A ratio of half a width of an active region of the bulk acoustic resonator to a thickness deviation of either one or both of the substrate protection layer and the membrane layer may be greater than 0.0150 and less than 0.0200.

In another general aspect, a filter includes bulk acoustic resonators, wherein each of the bulk acoustic resonators includes a substrate including an upper surface on which a substrate protection layer is disposed, and a membrane layer forming a cavity together with the substrate, wherein a thickness deviation of either one or both of the substrate protection layer and the membrane layer is 170 Å or less, and wherein the bulk acoustic resonators are connected to each other in series or in parallel.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
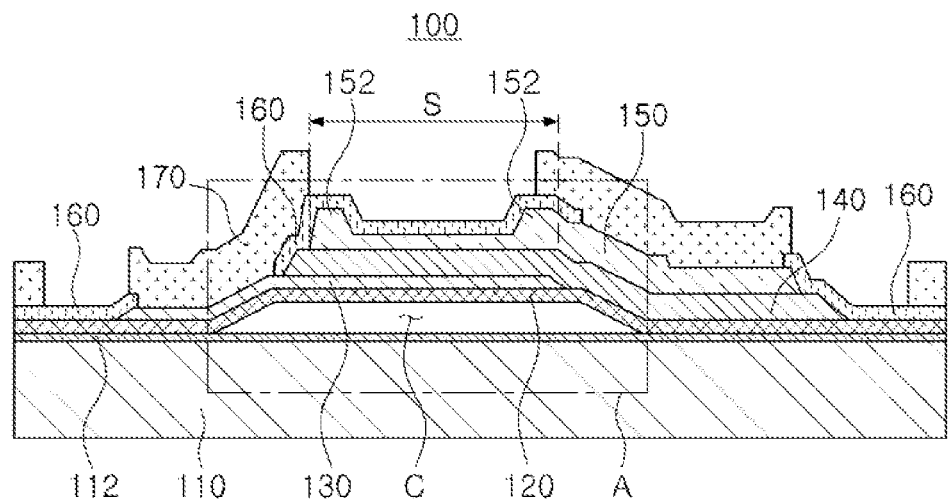
FIG. 1 is a schematic cross-sectional diagram illustrating a bulk acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
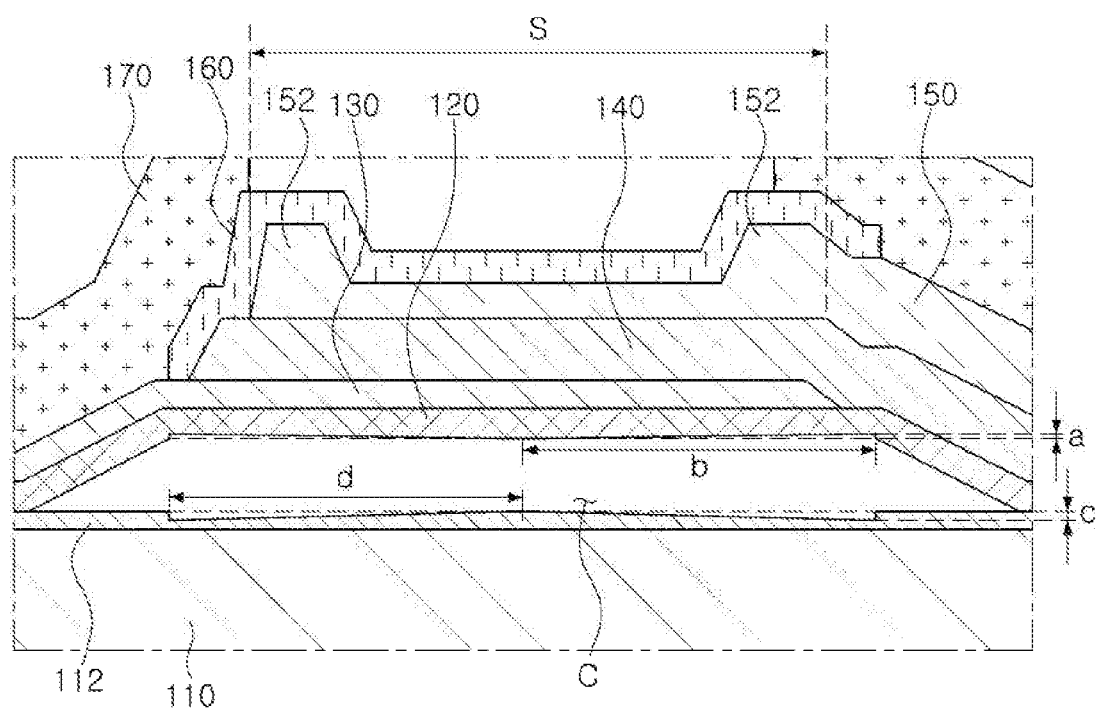
FIG. 2 is an enlarged view of part A of FIG. 1.

FIG. 1 is a schematic cross-sectional diagram illustrating a bulk acoustic resonator 100, according to an embodiment. FIG. 2 is an enlarged view of part A of FIG. 1.

Referring to FIGS. 1 and 2, the bulk acoustic resonator 100 includes a substrate 110, a membrane layer 120, a lower electrode 130, a piezoelectric layer 140, an upper electrode 150, a passivation layer 160, and a metal pad 170.

The substrate 110 is a substrate in which silicon is stacked. For example, a silicon wafer is used as the substrate. A substrate protection layer 112 is provided on the substrate 110 and is disposed to face a cavity C.

The substrate protection layer 112 prevents damage to the substrate 110 at the time of forming the cavity C. As an example, the substrate protection layer 112 is formed of a material containing silicon nitride (SiN) or silicon oxide (SiO$_2$).

The substrate protection layer 112 may be partially etched at the time of removing a sacrificial layer 180 (see FIGS. 4 through 9), as described below. For example, a thickness deviation of the substrate protection layer 112 may exceed 170 Å.

In more detail, the sacrificial layer 180 may be removed by a halide-based etching gas. A portion of the substrate protection layer 112 around an inlet (not illustrated) of the etching gas may be further etched by the etching gas than a portion of the substrate protection layer 112 in a central portion of an active region S of the bulk acoustic resonator 100.

A first length ratio c/d, illustrated in FIG. 2, is larger than a second length ratio a/b. That is, an etching rate at the time of removing the sacrificial layer 180 may be lower in the membrane layer 120 than that in the substrate protection layer 112.

The active region S is a region in which three layers composed of the lower electrode 130, the piezoelectric layer 140, and the upper electrode 150 are all stacked.

The membrane layer 120 and the substrate 110 form the cavity C. The membrane layer 120 is formed on a sacrificial layer 180 (see FIGS. 5 through 10) to be described below, and the membrane layer 120 forms the cavity C together with the substrate protection layer 112 through removal of the sacrificial layer 180. The membrane layer 120 is formed of a material having low reactivity with a halide-based etching gas containing fluorine (F), or chlorine (Cl), which is used for removing a silicon-based sacrificial layer 180.

As an example, the membrane layer 120 is formed of a dielectric layer including any one or any combination of any two or more of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or a metal layer including any one or any combination of any two or more of aluminum (Al), nickel (Ni), chromium (Cr), platinum (Pt), gallium (Ga), and hafnium (Hf). That is, as an example, even though xenon difluoride (XeF$_2$) is used to remove the sacrificial layer 180, the membrane layer 120 is formed of one of the aforementioned materials which have low reactivity with fluorine (F), such that a thickness decrease due to damage of the membrane layer 120 is prevented.

In more detail, according to the related art, as an example, when xenon difluoride (XeF$_2$) is used to remove the sacrificial layer 180, a configuration corresponding to a membrane layer and a halide-based etching gas react with each other, such that an inclined surface having an inclination may be formed in the configuration corresponding to the membrane layer, thereby deteriorating performance. However, since the membrane layer 120 is formed of the material having low reactivity with the halide-based etching gas containing fluorine (F), or chloride (Cl), as described above, damage of the membrane layer 120 by the etching gas is prevented, and thus, a thickness decreased due to damage of the membrane layer 120 is suppressed.

Figure 3:
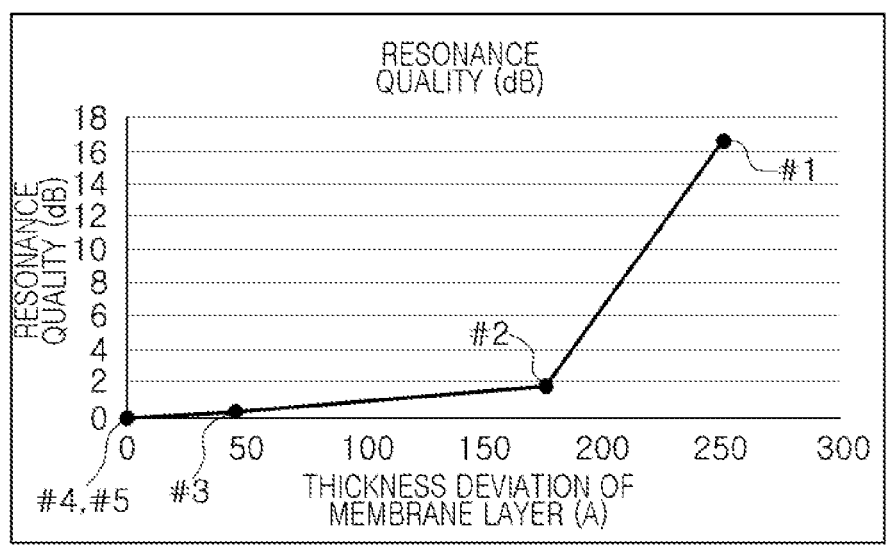
FIG. 3 is a graph illustrating an example effect of the bulk acoustic resonator of FIG. 1.

As described above, since the membrane layer 120 is formed of the dielectric layer including any one or any combination of any two or more of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or the metal layer including any one or any combination of any two or more of aluminum (Al), nickel (Ni), chromium (Cr), platinum (Pt), gallium (Ga), and hafnium (Hf), the thickness deviation of the membrane layer 120 after removing the sacrificial layer 180 may be 170 Å or less, as illustrated in FIG. 3.

Further, as illustrated in FIG. 3, it may be appreciated that in a case in which the thickness deviation exceeds 170 Å, resonance quality (dB) is rapidly increased. That is, as illustrated in FIG. 3, it may be appreciated that in a case in which the thickness deviation is increased, a resonance quality value is increased, such that performance of the bulk acoustic resonator 100 is deteriorated.

Still referring to FIG. 3, samples 1 and 2 correspond to cases in which a membrane layer is formed of a material according to the related art (for example, a material including silicon nitride (SiN) or silicon oxide (SiO$_2$)), samples 4 and 5 correspond to cases in which the membrane layer 120 is formed of aluminum nitride (AlN) or aluminum oxide (Al$_2$O$_3$), and sample 3 corresponds to a case in which a membrane layer is formed of heat-treated silicon oxide (SiO$_2$).

Figure 4:
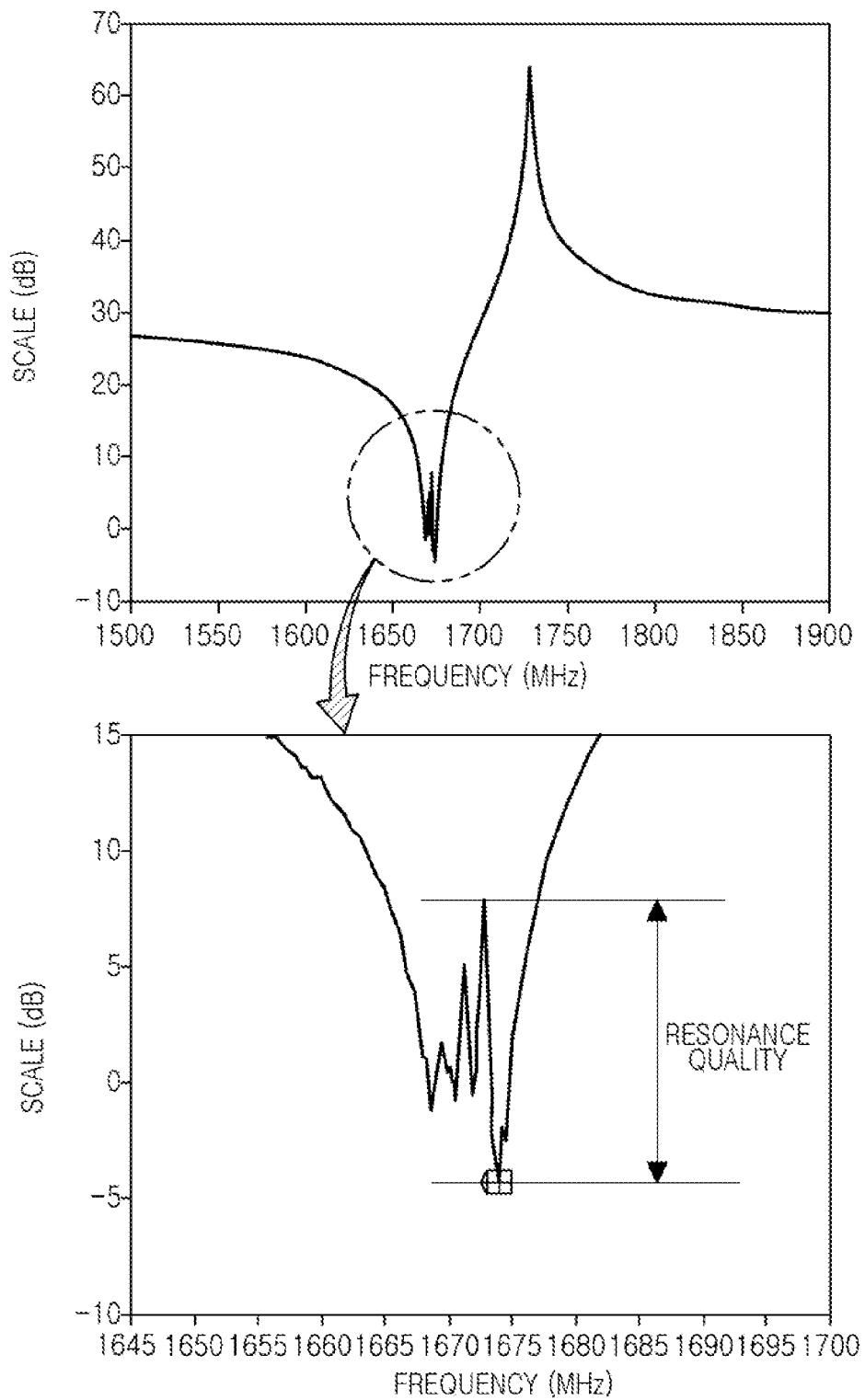
FIGS. 4 through 8 are graphs illustrating resonance quality in samples 1 to 5 of FIG. 3.

Further, FIGS. 4 through 8 are graphs illustrating resonance quality (dB) in samples 1 to 5 of FIG. 3. The term "resonance quality (dB)" means a difference between a minimum value and a maximum value of at least one inflection point. As illustrated in FIG. 4, it can be appreciated that a resonance quality value in sample 1 is about 16.57 dB.

Figure 5:
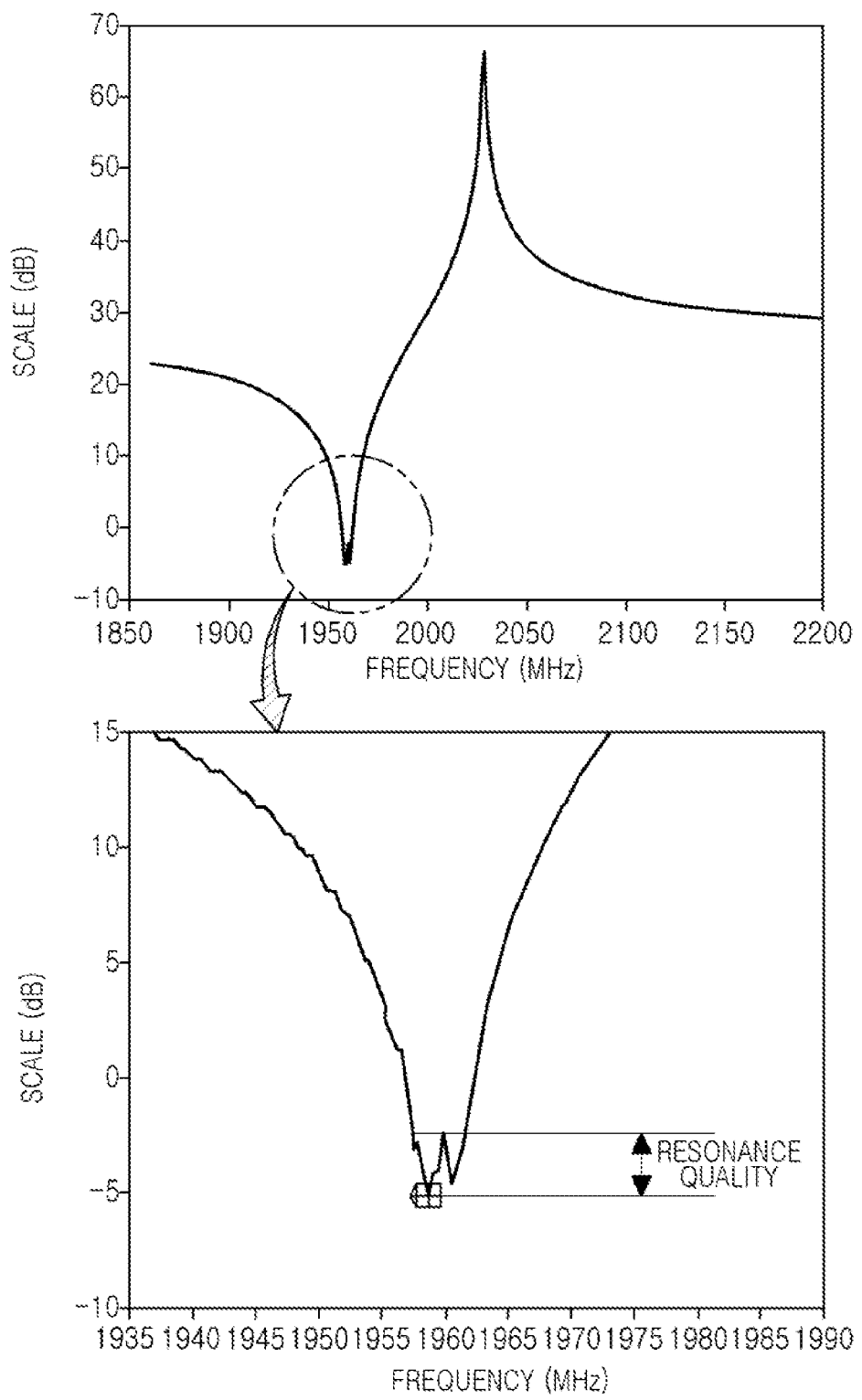

Further, as illustrated in FIG. 5, it can be appreciated that resonance quality value in sample 2 is about 1.85 dB.

Figure 6:
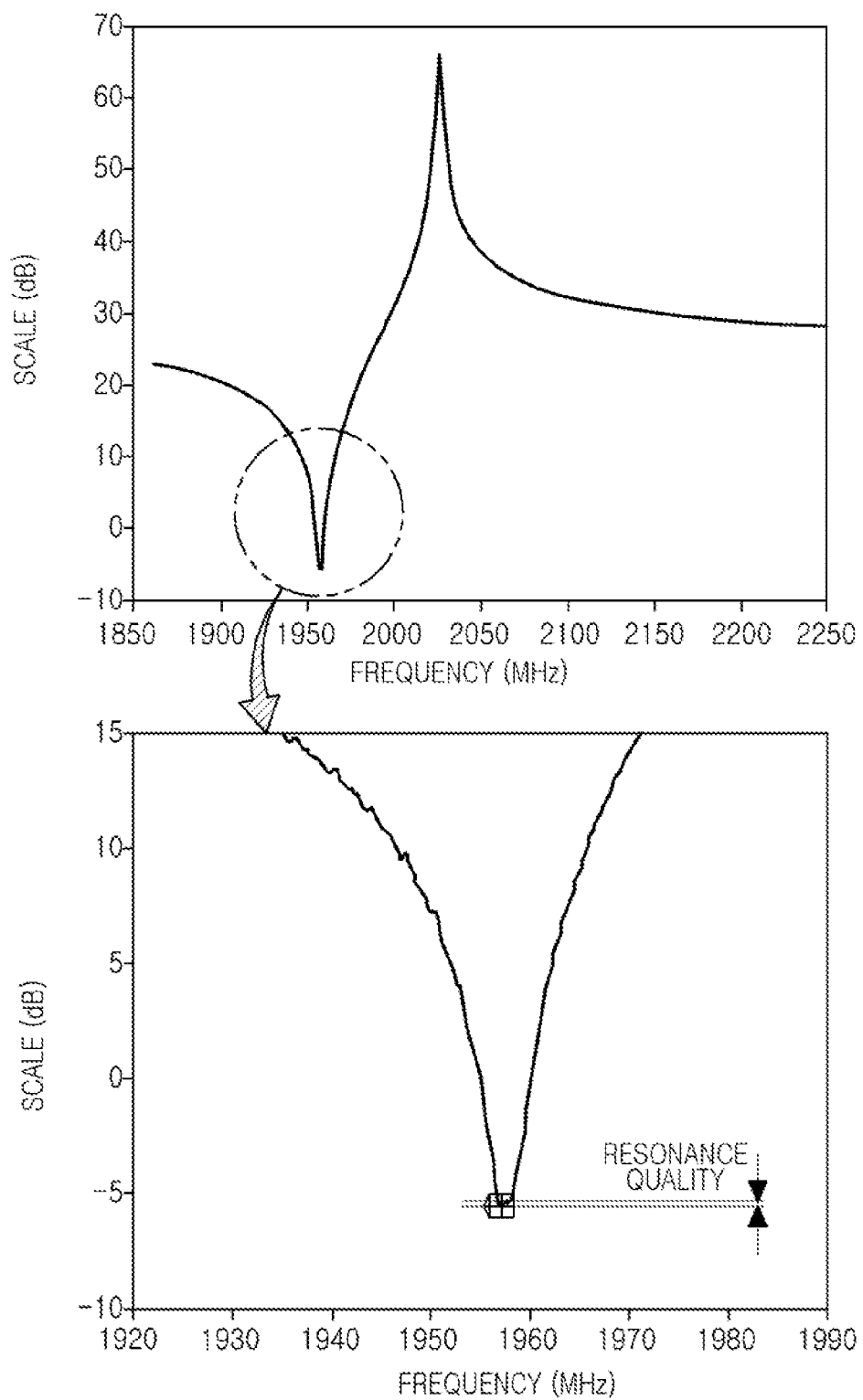

In addition, as illustrated in FIG. 6, it can be appreciated that resonance quality value in sample 3 is about 0.243 dB.

Figure 7:
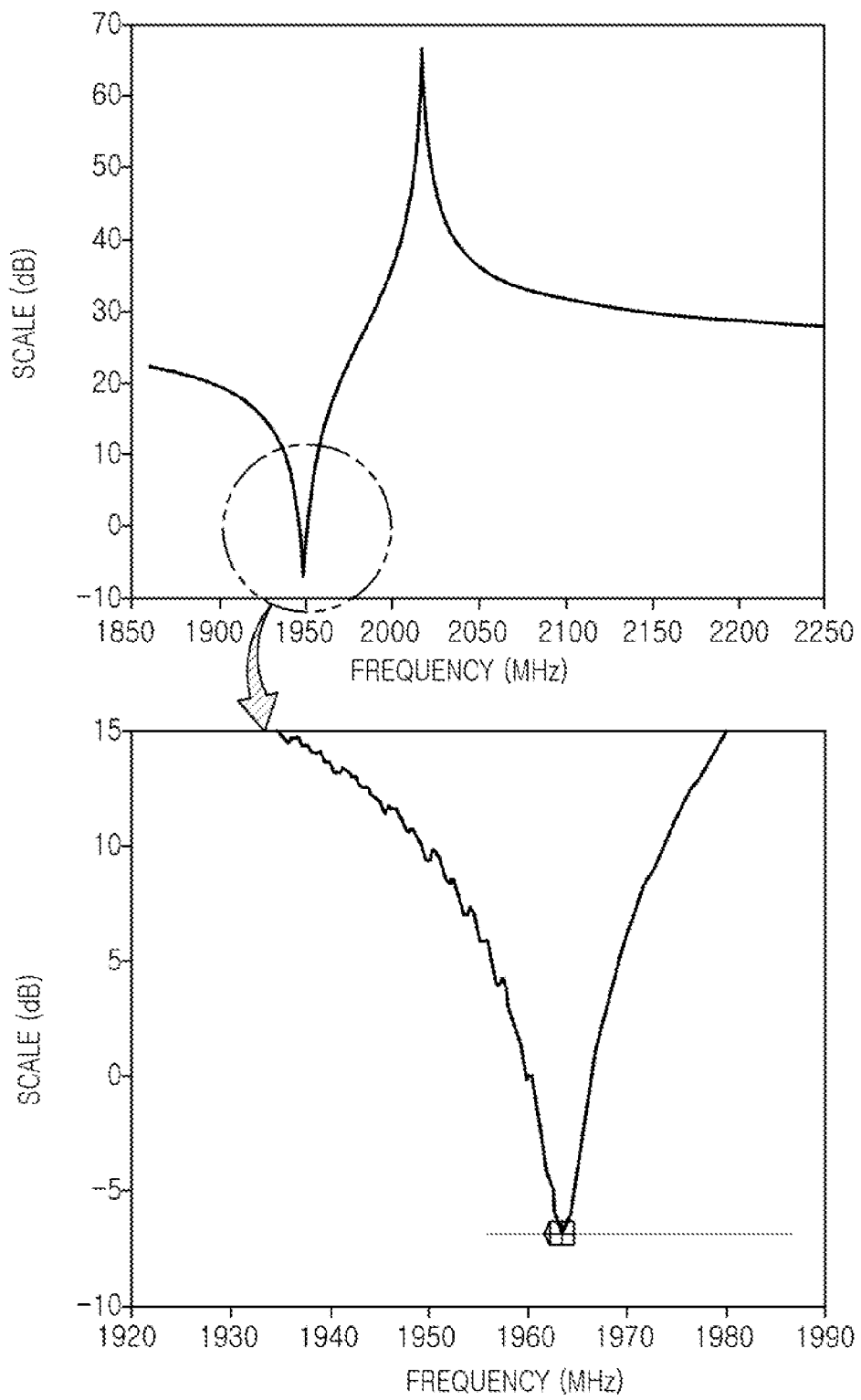
Figure 8:
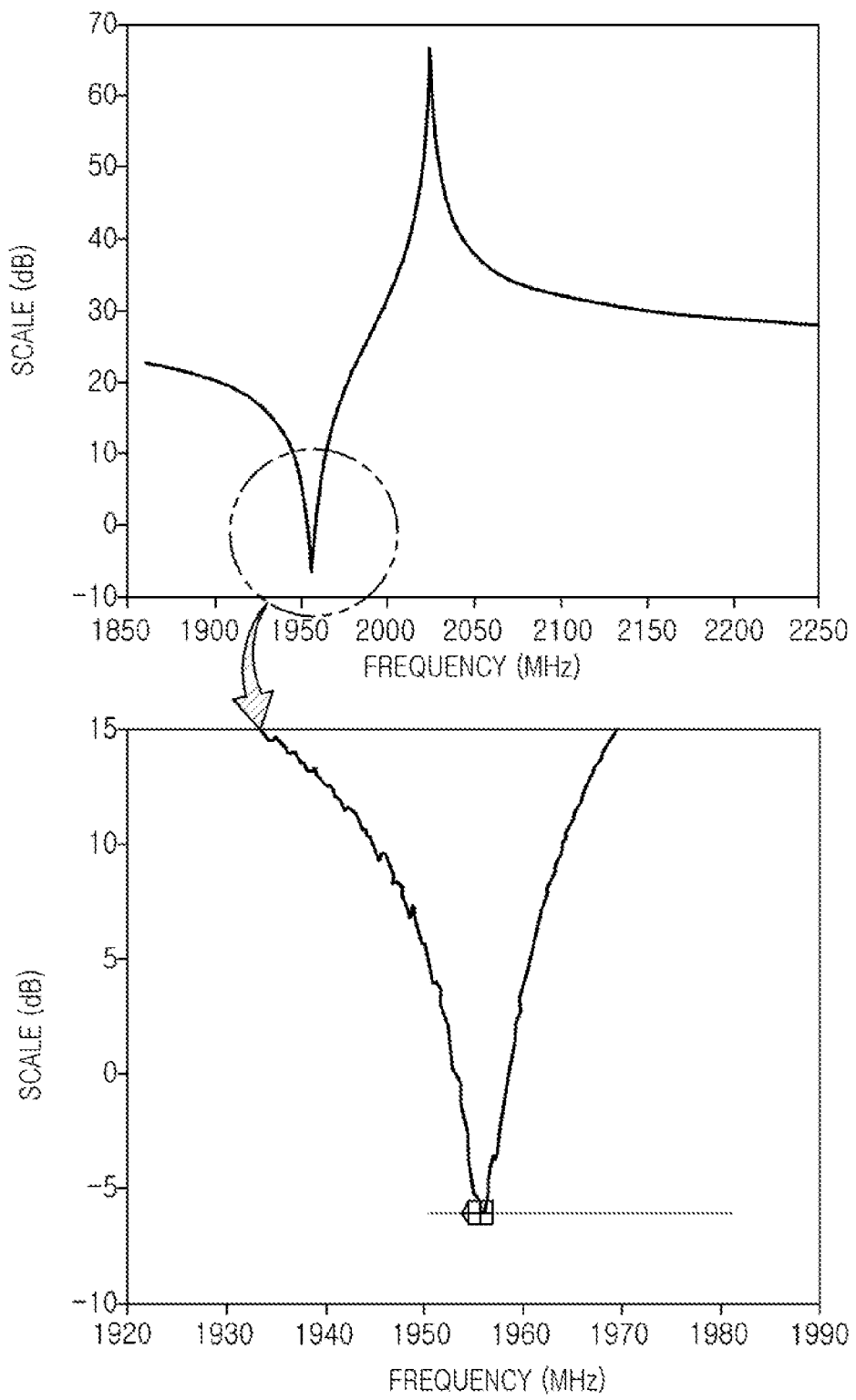

Further, as illustrated in FIGS. 7 and 8, it can be appreciated that resonance quality value in sample 4 is about 0.070 dB and resonance quality value in sample 5 is 0 dB.

As described above, it can be appreciated that, since the membrane layer 120 is formed of the dielectric layer including any one or any combination of any two or more of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or the metal layer including any one or any combination of any two or more of aluminum (Al), nickel (Ni), chromium (Cr), platinum (Pt), gallium (Ga), and hafnium (Hf), the resonance quality value is about 0.

As described above, since the resonance quality value in addition to the thickness deviation are close to 0, deteriorations in performance occurring at the time of removing the sacrificial layer are prevented.

The second length ratio a/b illustrated in FIG. 2 is greater than approximately 0.0150 but less than approximately 0.0200. As shown in FIG. 2, a is equal to half a width of the active region, and b is a thickness deviation formed by the etching.

As an example, the second length ratio a/b illustrated in FIG. 2 is 0.0176.

Referring to FIGS. 1 and 2, the lower electrode 130 is formed on the membrane layer 120. In more detail, the lower electrode 130 is formed on the membrane layer 120 to be partially disposed above the cavity C.

As an example, the lower electrode 130 is formed of a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt).

Further, the lower electrode 130 is used as one of an input electrode injecting an electric signal such as a radio frequency (RF) signal, and an output electrode. For example, in a case in which the lower electrode 130 is the input electrode, the upper electrode 150 is the output electrode, and in a case in which the lower electrode 130 is the output electrode, the upper electrode 150 is the input electrode.

Still referring to FIGS. 1 and 2, the piezoelectric layer 140 is formed to at least partially cover the lower electrode 130. Further, the piezoelectric layer 140 converts a signal input through the lower electrode 130 or the upper electrode 150 into elastic waves. That is, the piezoelectric layer 140 converts the electric signal into elastic waves by physical vibrations.

The piezoelectric layer 140 may be formed by depositing aluminum nitride, doped aluminum nitride, zinc oxide, or lead zirconate titanate. Further, in a case in which the piezoelectric layer 140 is formed of aluminum nitride (AlN), the piezoelectric layer 140 may further include a rare earth metal. As an example, the rare earth metal includes at least one of scandium (Sc), erbium (Er), yttrium (Y), and lanthanum (La). Additionally, the aluminum nitride (AlN) piezoelectric layer 140 may further include a transition metal. The transition metal may include at least one of zirconium (Zr), titanium (Ti), magnesium (Mg), and hafnium (Hf).

Referring again to FIGS. 1 and 2, the upper electrode 150 is formed to cover the piezoelectric layer 140 and is formed of a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt), similarly to the lower electrode 130.

As shown in FIGS. 1 and 2, a frame portion 152 is provided in the upper electrode 150. The frame portion 152 is a portion of the upper electrode 150 having a thickness that is greater than a thickness of the other portions of the upper electrode 150. Further, the frame portion 152 is provided in the upper electrode 150 and is disposed in a portion of the active region S except for the central portion of the active region S.

In addition, the frame portion 152 reflects lateral waves occurring at the time of resonance to an internal portion of the active region S to store resonance energy in the active region S. More specifically, the frame portion 152 is disposed at an edge of the active region S to prevent vibrations from being released from the active region S to the outside.

The passivation layer 160 is formed on portions of the membrane 120, the lower electrode 130, the piezoelectric layer 140, and the upper electrode 150, excepting some portions of the lower and upper electrodes 130 and 150. The passivation layer 160 prevents the upper and lower electrodes 150 and 130 from being damaged during a process.

Further, a thickness of the passivation layer 160 may be adjusted by etching in order to adjust a resonant frequency in a final process. The same material used in the membrane layer 120 may be used in the passivation layer 160. As an example, the dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) is used in the passivation layer 160.

The metal pad 170 is formed on the portions of the lower and upper electrodes 130 and 150 on which the passivation layer 160 is not formed. As an example, the metal pad 170 is formed of a material such as gold (Au), a gold-tin (Au—Sn) alloy, copper (Cu), or a copper-tin (Cu—Sn) alloy.

As described above, it may appreciated that, since the membrane layer 120 is formed of the dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or the metal layer including any one or any combination of any two or more of aluminum (Al), nickel (Ni), chromium (Cr), platinum (Pt), gallium (Ga), and hafnium (Hf), damage of the membrane layer 120 is prevented by suppressing a reaction with the halide-based etching gas including fluorine (F) or chlorine (Cl). As a result, a thickness decrease due to damage of the membrane layer 120 may be significantly suppressed, and finally, performance deterioration of the bulk acoustic resonator 100 is prevented.

Hereinafter, an example method of manufacturing the bulk acoustic resonator 100 will be described.

FIGS. 9 through 18 are process flow charts illustrating a method for manufacturing the bulk acoustic resonator 100, according to an embodiment.

Figure 9:
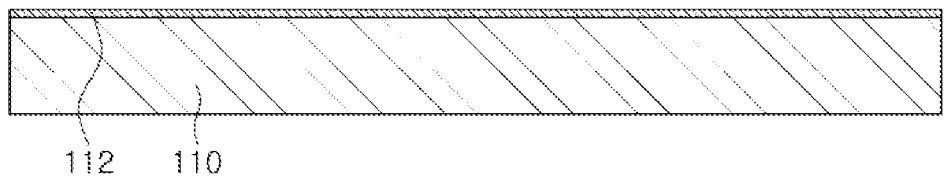
FIGS. 9 through 18 are process flow charts illustrating a method for manufacturing the bulk acoustic resonator of FIG. 1, according to an embodiment.

First, as illustrated in FIG. 9, the substrate protection layer 112 is formed on the substrate 110. As an example, the substrate protection layer 112 is formed of the material containing silicon nitride (SiN) or silicon oxide ($SiO_2$).

Figure 10:
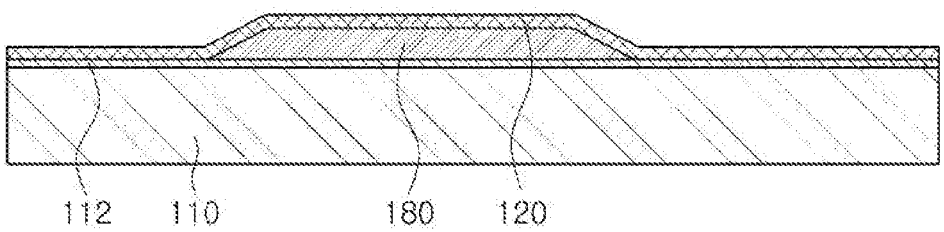

Thereafter, as illustrated in FIG. 10, the sacrificial layer 180 is formed on the substrate protection layer 112, and the membrane layer 120 is formed to cover the sacrificial layer 180. The sacrificial layer 180 is formed of a silicon-based material and removed by the halide-based etching gas containing fluorine (F) or chlorine (Cl).

Finally, at the time of removing the sacrificial layer 180, the membrane layer 120 and the substrate 110 form the cavity C. The membrane layer 120 is formed of the material having low reactivity with the halide-based etching gas containing fluorine (F) or chlorine (Cl), which is used for removing the silicon-based sacrificial layer 180.

As an example, the membrane layer 120 is formed of the dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or the metal layer including any one or any combination of any two or more of aluminum (Al), nickel (Ni), chromium (Cr), platinum (Pt), gallium (Ga), and hafnium (Hf).

Figure 11:
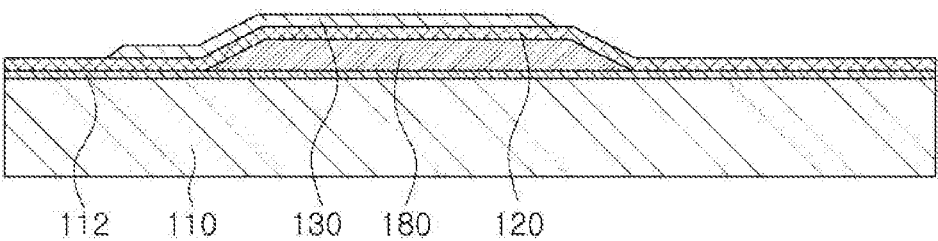

Then, as illustrated in FIG. 11, the lower electrode 130 is formed on the membrane layer 120. The lower electrode 130 is formed to be partially disposed on the sacrificial layer 180 and to partially protrude outwardly of the sacrificial layer 180.

As an example, the lower electrode 130 is formed of the conductive material such as molybdenum (Mo), ruthenium (Ru), tungsten (W), iridium (Ir), or platinum (Pt).

Figure 12:
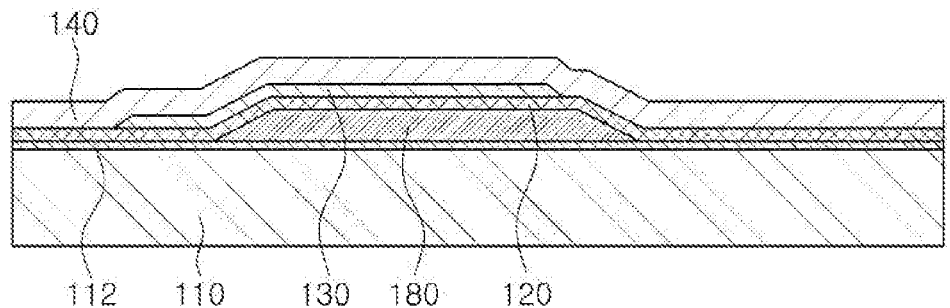

Next, as illustrated in FIG. 12, the piezoelectric layer 140 is formed to cover the lower electrode 130. The piezoelectric layer 140 may be formed by depositing aluminum nitride, doped aluminum nitride, zinc oxide, or lead zirconate titanate. Further, the piezoelectric layer 140, when formed of aluminum nitride (AlN), may further include a rare earth metal. As an example, the rare earth metal includes at least one of scandium (Sc), erbium (Er), yttrium (Y), and lanthanum (La). Further, the piezoelectric layer 140, when formed of aluminum nitride (AlN), may further include a transition metal. The transition metal may include at least one of zirconium (Zr), titanium (Ti), magnesium (Mg), and hafnium (Hf).

As an example, the piezoelectric layer 140 is formed to entirely cover the membrane layer 120 and the lower electrode 130. However, the piezoelectric layer 140 is not limited to such a configuration, and may be formed to be disposed above, or on top of, the cavity C and one side around the cavity C.

Figure 13:
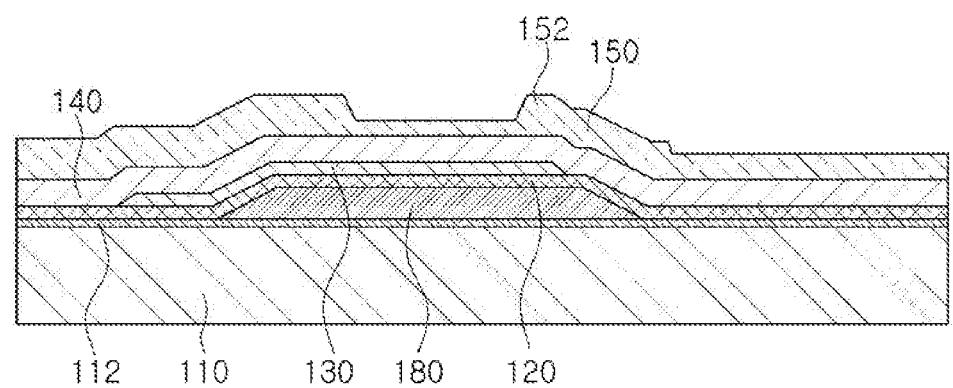

Thereafter, as shown in FIG. 13, the upper electrode 150 is formed on the piezoelectric layer 140. The upper electrode 150 may be formed of the conductive material such as molybdenum (Mo), ruthenium (Ru), tungsten (W), iridium (Ir), or platinum (Pt), or alloys of molybdenum (Mo), ruthenium (Ru), tungsten (W), iridium (Ir), or platinum (Pt), similarly to the lower electrode 130. The frame portion 152 is provided in the upper electrode 150. Further, the frame portion 152 is provided in the upper electrode 150 to be disposed in a portion of the active region S except for the central portion of the active region S.

In addition, the frame portion 152 reflects a lateral wave occurring at the time of resonance to an internal portion of the active region S to store resonance energy in the active region S. More specifically, the frame portion 152 is disposed at an edge of the active region S to prevent vibration from being released from the active region S to the outside.

Figure 14:
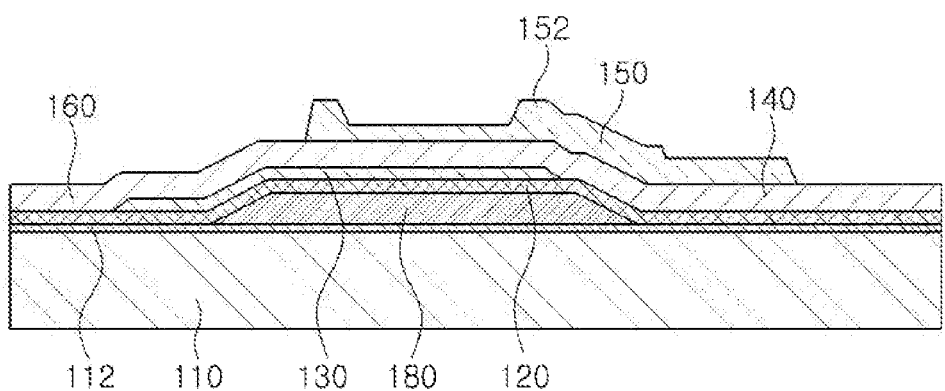

Next, as illustrated in FIG. 14, the upper electrode 150 is partially removed by dry-etching. A portion of the upper electrode 150 partially removed by dry-etching is disposed on, or on top of, the cavity C, and the other portion of the upper electrode 150 extends outwardly of the cavity C.

Figure 15:
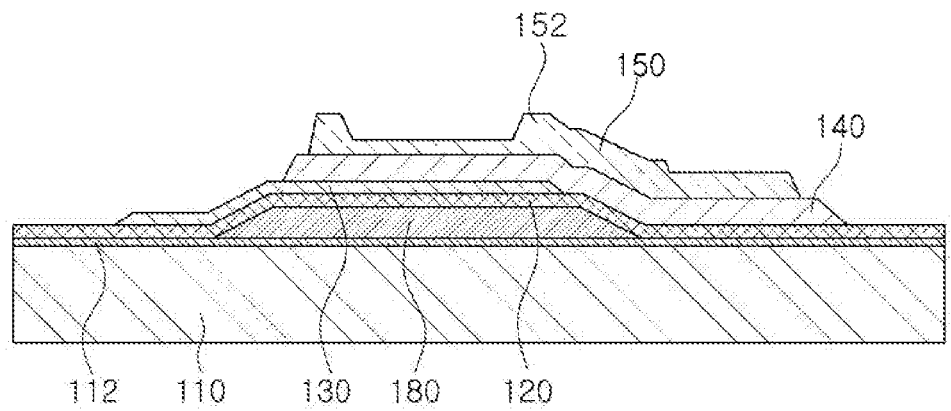

Then, as illustrated in FIG. 15, an edge portion of the piezoelectric layer 140 is removed by etching. Therefore, the lower electrode 130 may be partially externally exposed, below the piezoelectric layer 140.

Figure 16:
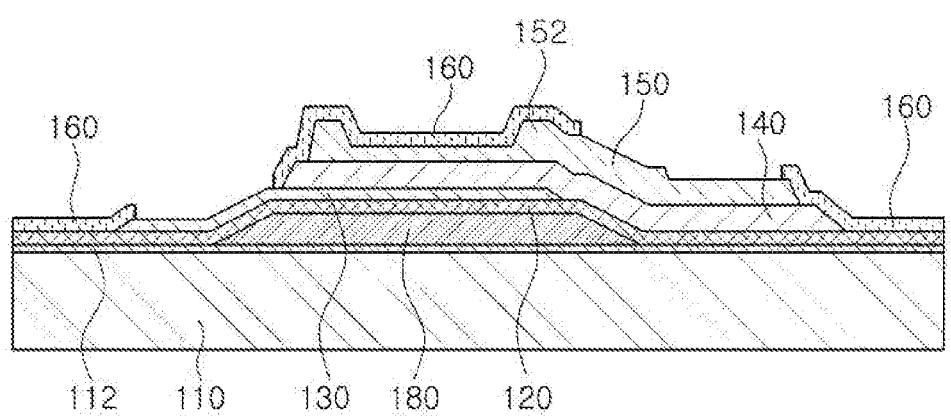

Then, as illustrated in FIG. 16, the passivation layer 160 is formed so that the upper and lower electrodes 150 and 130 are partially externally exposed.

Figure 17:
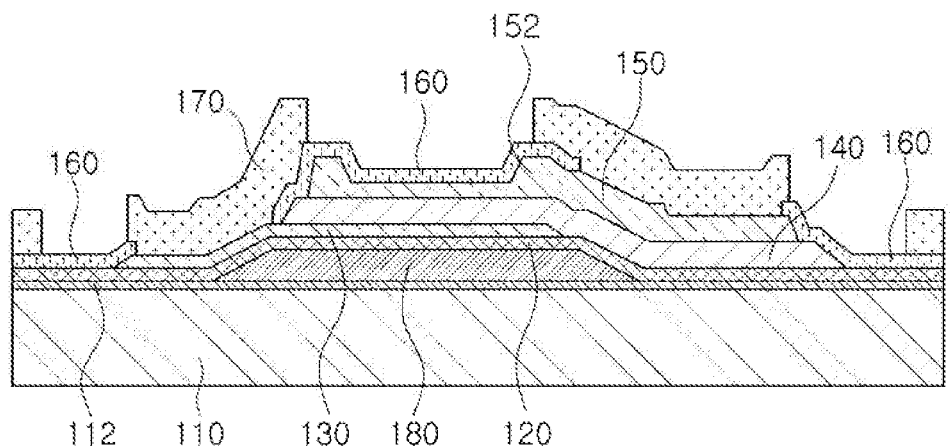

Next, as illustrated in FIG. 17, the metal pad 170 is formed on the upper and lower electrodes 150 and 130 exposed externally. The metal pad 170 is formed of a metal material such as gold (Au), the gold-tin (Au—Sn) alloy, copper (Cu), or the copper-tin (Cu—Sn) alloy.

Figure 18:
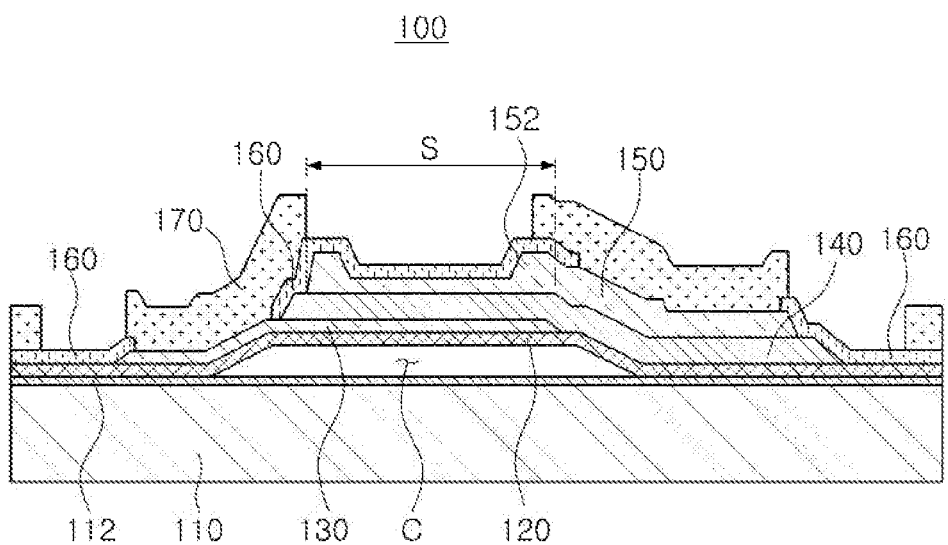

Thereafter, as illustrated in FIG. 18, the cavity C is formed below the membrane layer 120 by removing the sacrificial layer 180.

The sacrificial layer 180 may be removed by a reaction with the halide-based etching gas containing fluorine (F), or chlorine (Cl). That is, the sacrificial layer 180 may be removed by supplying the halide-based etching gas so that the sacrificial layer 180 and the halide-based etching gas contact each other, such that the cavity C is formed.

Since the membrane layer 120 forming the cavity C is formed of the dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or the metal layer including any one or any combination of any two or more of aluminum (Al), nickel (Ni), chromium (Cr), platinum (Pt), gallium (Ga), and hafnium (Hf), damage to the membrane 120 by the etching gas is prevented.

As an example, even though xenon difluoride ($XeF_2$) is used to remove the sacrificial layer 180, the membrane layer 120 is of one of the above-mentioned materials which have low reactivity with fluorine (F), such that a thickness decrease due to damage of the membrane layer 120 is prevented.

Figure 19:
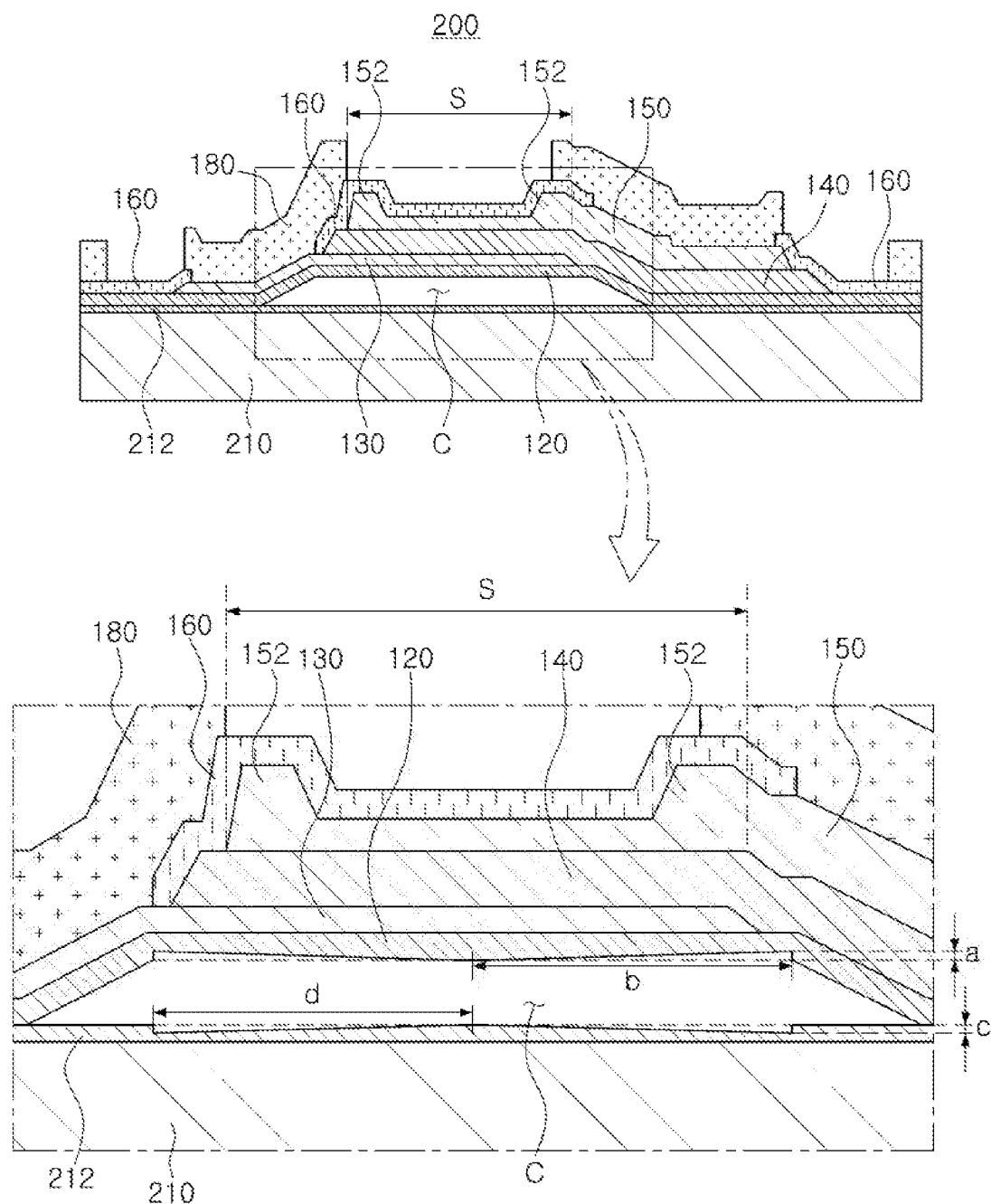
FIG. 19 is a schematic cross-sectional diagram illustrating a bulk acoustic resonator, according to another embodiment.

FIG. 19 is a schematic cross-sectional diagram illustrating a bulk acoustic resonator 200, according to another embodiment.

Referring to FIG. 19, the bulk acoustic resonator 200 includes a substrate 210, a membrane layer 120, a lower electrode 130, a piezoelectric layer 140, an upper electrode 150, a passivation layer 160, and a metal pad 170.

Since the membrane layer 120, the lower electrode 130, the piezoelectric layer 140, the upper electrode 150, the passivation layer 160, and the metal pad 170 are the same components as those described above in the embodiment of FIG. 1, a description of these components will not be repeated.

The substrate 210 is a substrate in which silicon is stacked. For example, a silicon wafer is used as the substrate. A substrate protection layer 212 is provided on the substrate 210 and is disposed to face the cavity C. The substrate protection layer 212 prevents damage to the substrate 210 at the time of forming the cavity C.

As an example, the substrate protection layer 212 is formed of a dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer including any one or any combination of any two or more of aluminum (Al), nickel (Ni), chromium (Cr), platinum (Pt), gallium (Ga), and hafnium (Hf).

That is, as an example, even though xenon difluoride ($XeF_2$) is used to remove the sacrificial layer 180, the substrate protection layer 212 is formed of one of the above-mentioned materials which have low reactivity with fluorine (F), such that a thickness decrease due to damage of the substrate protection layer 212 is prevented.

The substrate protection layer 212 may be partially etched at the time of removing the sacrificial layer 180 (see FIGS. 4 through 9), as described below. For example, a thickness deviation of the substrate protection layer 212 is 170 Å or less.

In more detail, the sacrificial layer 180 may be removed by a halide-based etching gas. A portion of the substrate protection layer 212 around an inlet (not illustrated) of the etching gas may be further etched by the etching gas than a portion of the substrate protection layer 212 in a central portion of the active region S. As described above, the active region S is a region in which three layers composed of the lower electrode 130, the piezoelectric layer 140, and the upper electrode 150 are all stacked.

However, the substrate protection layer 212 may be formed of one of the materials described above which have low reactivity with fluorine (F), such that the thickness deviation formed by the etching is decreased.

As described above, since the substrate protection layer 212 and the membrane layer 120 forming the cavity C are formed of the dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or the metal layer including any one or any combination of any two or more of aluminum (Al), nickel (Ni), chromium (Cr), platinum (Pt), gallium (Ga), and hafnium (Hf), damage to the substrate protection layer 212 and the membrane layer 120 by the etching gas is prevented.

As an example, even though xenon difluoride ($XeF_2$) is used to remove the sacrificial layer 180, the substrate protection layer 212 and the membrane layer 120 are formed of one of the above-mentioned materials which have low reactivity with fluorine (F), such that a thickness decrease due to damage of the substrate protection layer 212 and the membrane layer 120 is prevented.

The length ratio (a/b) illustrated in FIG. 19 may be greater than approximately 0.0150 but less than approximately 0.0200. As shown in FIG. 19, a is equal to half a width of the active region, and b is a thickness deviation formed by the etching of the substrate protection layer 212 and the membrane layer 120.

As an example, the length ratio a/b illustrated in FIG. 19 is 0.0176.

Figure 20:
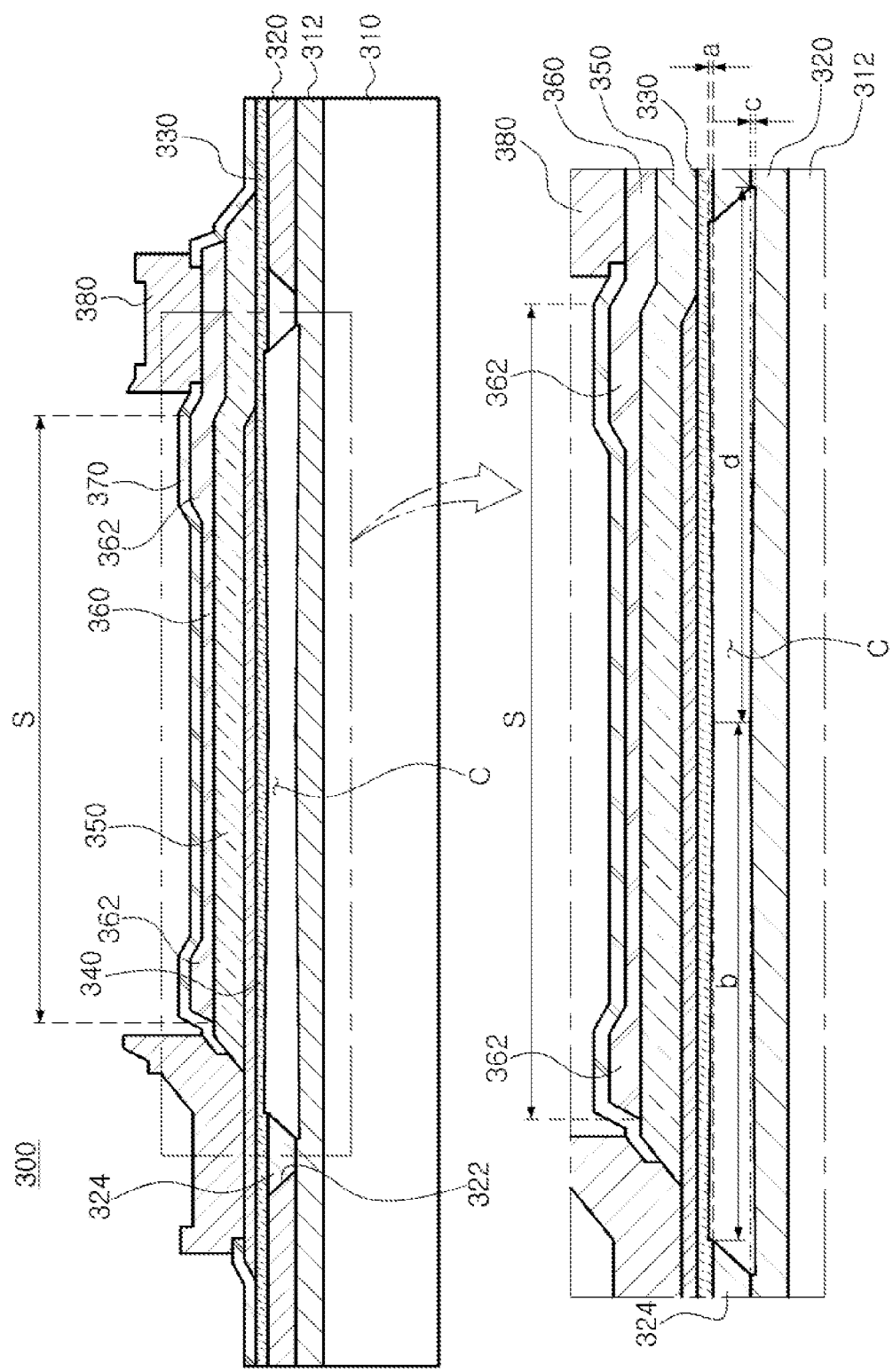
FIG. 20 is a schematic cross-sectional diagram illustrating a bulk acoustic resonator, according to another embodiment.

FIG. 20 is a schematic cross-sectional diagram illustrating a bulk acoustic resonator 300, according to another embodiment.

Referring to FIG. 20, the bulk acoustic resonator 300 includes a substrate 310, a cavity forming layer 320, a membrane layer 330, a lower electrode 340, a piezoelectric layer 350, an upper electrode 360, a passivation layer 370, and a metal pad 380.

The substrate 310 is a substrate in which silicon is stacked. For example, a silicon wafer is used as the substrate. A substrate protection layer 312 for protecting silicon is formed on an upper surface of the substrate 310.

The substrate protection layer 312 prevents damage to the substrate 310 at the time of forming a cavity C. As an example, the substrate protection layer 312 is formed of a material containing silicon nitride (SiN) or silicon oxide ($SiO_2$).

The substrate protection layer 312 may be partially etched at the time of removing a sacrificial layer (not illustrated), as described below. That is, a thickness deviation of the substrate protection layer 312 may exceed 170 Å.

In more detail, the sacrificial layer may be removed by a halide-based etching gas. A portion of the substrate protection layer 312 around an inlet (not illustrated) of the etching gas may be further etched by the etching gas than a portion of the substrate protection layer 312 in a central portion of the active region S. The active region S is a region in which three layers composed of the lower electrode 340, the piezoelectric layer 350, and the upper electrode 360 are all stacked.

The cavity forming layer 320 is formed on the substrate 310, and the cavity C is formed by a groove portion 322 of the cavity forming layer 320 and the membrane layer 330. That is, after the sacrificial layer is formed in the groove portion 322 of the cavity forming layer 320, the cavity C is formed by removing the sacrificial layer.

Since the cavity C is formed in the cavity forming layer 320 as described above, other layers and components formed on the cavity forming layer 320, for example, the lower electrode 340 and the piezoelectric layer 350, may be formed to be flat.

An etch stop layer 324 for preventing etching of the cavity forming layer 320 at the time of removing the sacrificial layer may be provided in an edge of the cavity forming groove 322.

The membrane layer 330 forms the cavity C together with the substrate 310. The membrane layer 330 is formed on top of, or above, the cavity forming layer 320 and above the cavity C, and the membrane layer 330 forms the cavity C together with the substrate protection layer 312 upon removal of the sacrificial layer (not illustrated). The membrane layer 330 may be formed of the material having low reactivity with the halide-based etching gas containing fluorine (F) or chlorine (Cl), which is used for removing the silicon-based sacrificial layer 180.

As an example, the membrane layer 330 is formed of a dielectric layer including any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer including any one or any combination of any two or more of aluminum (Al), nickel (Ni), chromium (Cr), platinum (Pt), gallium (Ga), and hafnium (Hf).

That is, as an example, even though xenon difluoride ($XeF_2$) is used to remove the sacrificial layer, the membrane layer 330 is formed of one of the above-mentioned materials which have low reactivity with fluorine (F), such that a thickness decrease due to damage of the membrane layer 330 is prevented. In more detail, according to the related art, as an example, when xenon difluoride ($XeF_2$) is used to remove the sacrificial layer, a configuration corresponding to a membrane layer and a halide-based etching gas react with each other, such that an inclined surface having an inclination is formed in the configuration corresponding to the membrane layer, thereby deteriorating performance off the bulk acoustic resonator.

However, since the membrane layer 330 is formed of the material having low reactivity with the halide-based etching gas such as fluorine (F), or chloride (Cl), as described above, damage of the membrane layer 330 by the etching gas is prevented, and thus, a thickness decrease due to damage of the membrane layer 330 is suppressed.

The lower electrode 340 is formed on the membrane layer 330. In more detail, the lower electrode 340 is formed on the membrane layer 330 to be partially disposed above, or on top of, the cavity C.

As an example, the lower electrode 340 is formed of a conductive material such as molybdenum (Mo), ruthenium (Ru), tungsten (W), iridium (Ir), or platinum (Pt), or alloys of molybdenum (Mo), ruthenium (Ru), tungsten (W), iridium (Ir), or platinum (Pt).

Further, the lower electrode 340 is used as one of an input electrode injecting an electric signal such as a radio frequency (RF) signal, and an output electrode. For example, in a case in which the lower electrode 340 is the input electrode, the upper electrode 360 is the output electrode, and in a case in which the lower electrode 340 is the output electrode, the upper electrode 360 is the input electrode.

The piezoelectric layer 350 is formed to at least partially cover the lower electrode 340. Further, the piezoelectric layer 350 converts a signal input through the lower electrode 340 or the upper electrode 360 into elastic waves. That is, the piezoelectric layer 350 converts the electric signal into elastic waves by physical vibration.

As an example, the piezoelectric layer 350 may be formed by depositing aluminum nitride, doped aluminum nitride, zinc oxide, or lead zirconate titanate. Further, when formed of aluminum nitride (AlN), the piezoelectric layer 140 may further include a rare earth metal. The rare earth metal may include at least one of scandium (Sc), erbium (Er), yttrium (Y), and lanthanum (La). Further, the piezoelectric layer 140, when formed of aluminum nitride (AlN), may further include a transition metal. The transition metal may include at least one of zirconium (Zr), titanium (Ti), magnesium (Mg), and hafnium (Hf).

The upper electrode 360 is formed to cover the piezoelectric layer 350, and is formed of a conductive material such as molybdenum (Mo), ruthenium (Ru), tungsten (W), iridium (Ir), or platinum (Pt), or alloys molybdenum (Mo), ruthenium (Ru), tungsten (W), iridium (Ir), or platinum (Pt), similarly to the lower electrode 340.

A frame portion 362 is provided in the upper electrode 360. The frame portion 362 is portion of the upper electrode 360 having a thickness that is greater than a thickness of the other portions of the upper electrode 360. Further, the frame portion 362 is provided in the upper electrode 360 to be disposed in a portion of the active region S except for the central portion of the active region S.

In addition, the frame portion 362 reflects a lateral wave occurring at the time of resonance to an internal portion of the active region S to store resonance energy in the active region S. In other words, the frame portion 362 is disposed at an edge of the active region S to prevent vibrations from being released from the active region S to the outside.

The passivation layer 370 is formed on portions of the membrane layer 330, the lower electrode 340, the piezoelectric layer 350, and the upper electrode 360, excepting some portions of the lower and upper electrodes 340 and 360. The passivation layer 370 prevents the upper and lower electrodes 360 and 340 from being damaged during a process.

Further, a thickness of the passivation layer 370 may be adjusted by etching in order to adjust a resonant frequency in a final process.

The metal pad 380 is formed on the portions of the lower and upper electrodes 340 and 360 on which the passivation layer 370 is not formed. As an example, the metal pad 380 is formed of a metal material such as gold (Au), a gold-tin (Au—Sn) alloy, copper (Cu), or a copper-tin (Cu—Sn) alloy.

As described above, it can be appreciated that since the membrane layer 330 is formed of the dielectric layer including any one or any combination of any two or more of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or the metal layer including any one or any combination of any two or more of aluminum (Al), nickel (Ni), chromium (Cr), platinum (Pt), gallium (Ga), and hafnium (Hf), damage of the membrane layer 330 is prevented by suppressing a reaction with the halide-based etching gas such as fluorine (F) or chlorine (Cl). As a result, a thickness decrease due to damage of the membrane layer 330 is significantly suppressed, and finally, performance deterioration is prevented.

Hereinafter, a filters including bulk acoustic resonators will be described with reference to the accompanying drawings.

Figure 21:
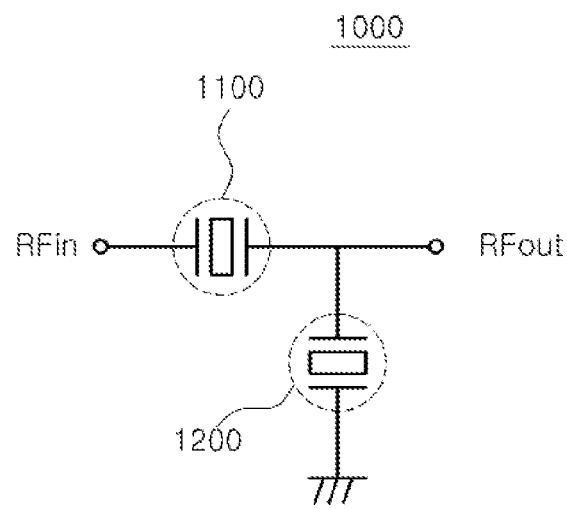
FIG. 21 is a schematic circuit diagram illustrating a filter, according tan embodiment.

FIG. 21 is a schematic circuit diagram illustrating a filter 1000, according to an embodiment.

Referring to FIG. 21, the filter 1000 has a ladder type filter structure. More specifically, the filter 1000 includes a first bulk acoustic resonator 1100 and a second bulk acoustic resonator 1200. The first and second bulk acoustic resonators 1100 and 1200 may each be the bulk acoustic resonator 100 illustrated in FIG. 1. The first bulk acoustic resonator 1100 is connected in series between a signal input terminal receiving an input signal RFin and a signal output terminal outputting an output signal RFout. The second bulk acoustic resonator 1200 is connected between the signal output terminal and the ground.

Figure 22:
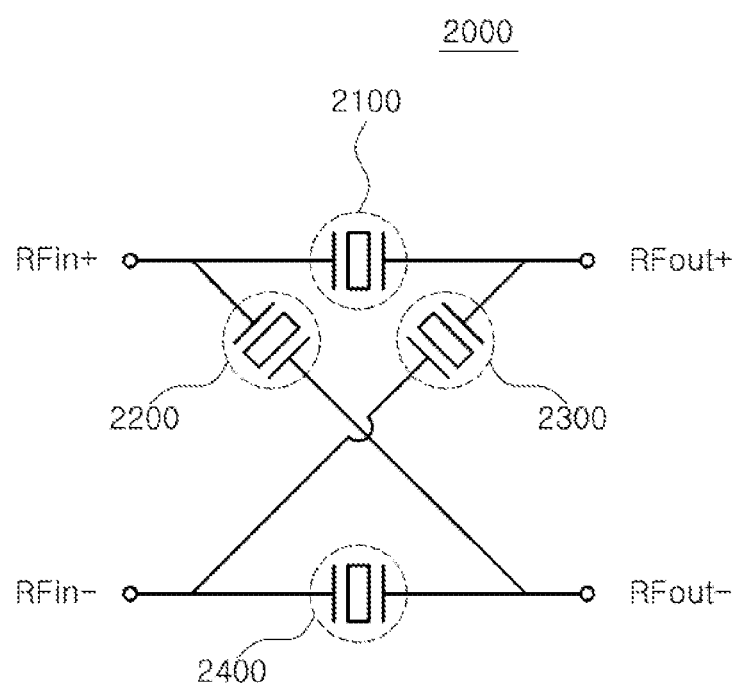
FIG. 22 is a schematic circuit diagram illustrating a filter, according to another embodiment.

FIG. 22 is a schematic circuit diagram illustrating a filter 2000, according to another embodiment.

Referring to FIG. 22, the filter 2000 has a lattice type filter structure. More specifically, the filter 2000 includes bulk acoustic resonators 2100, 2200, 2300, and 2400 and filter balanced input signals RFin+ and RFin− to output balanced output signals RFout+ and RFout−. The bulk acoustic resonators 2100, 2200, 2300, and 2400 may each be the bulk acoustic resonator 100 illustrated in FIG. 1.

As set forth above, according embodiments disclosed herein, at the time of removing a sacrificial layer of a bulk acoustic resonator, damage of a membrane layer and/or a substrate protection layer is decreased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising:
   a substrate comprising an upper surface on which a substrate protection layer is disposed; and
   a membrane layer forming a cavity together with the substrate,
   wherein a thickness of either one or both of the substrate protection layer and the membrane layer is greater at a center of an active region of the bulk acoustic resonator than at an edge of the active region, and
   wherein a thickness deviation of either one or both of the substrate protection layer and the membrane layer is 170 Å or less.

2. The bulk acoustic resonator of claim 1, further comprising:
   a lower electrode disposed on the membrane layer;
   a piezoelectric layer configured to partially cover the lower electrode; and
   an upper electrode disposed on the piezoelectric layer.

3. The bulk acoustic resonator of claim 2, wherein the upper electrode comprises a frame portion disposed at the edge of the active region.

4. The bulk acoustic resonator of claim 3, wherein a ratio of half a width of the active region to the thickness deviation of either one or both of the substrate protection layer and the membrane layer is greater than 0.0150 and less than 0.0200.

5. The bulk acoustic resonator of claim 2, further comprising:
   a passivation layer disposed on portions of the upper and lower electrodes; and a metal pad formed on other portions of the upper and lower electrodes on which the passivation layer is not formed.

6. The bulk acoustic resonator of claim 1, wherein either one or both of the substrate protection layer and the membrane layer comprise
a dielectric layer comprising any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or
a metal layer comprising any one or any combination of any two or more of aluminum (Al), nickel (Ni), chromium (Cr), platinum (Pt), gallium (Ga), and hafnium (Hf).

7. The bulk acoustic resonator of claim 6, wherein the membrane layer comprises the dielectric layer, and the substrate protection layer comprises either one of silicon nitride and silicon oxide.

8. The bulk acoustic resonator of claim 6, wherein the substrate protection layer comprises the dielectric layer, and the membrane layer comprises either one of silicon nitride and silicon oxide.

9. A bulk acoustic resonator, comprising:
a substrate comprising an upper surface on which a substrate protection layer is formed; and
a membrane layer forming a cavity together with the substrate,
wherein a thickness of either one or both of the substrate protection layer and the membrane layer is greater at a center of an active region of the bulk acoustic resonator than at an edge of the active region, and
wherein either one or both of the substrate protection layer and the membrane layer comprise
a dielectric layer comprising any one or any combination of any two or more of manganese oxide (MgO), zirconium oxide ($ZrO_2$), lead zirconate titanate (PZT), gallium arsenide (GaAs), hafnium oxide ($HfO_2$), titanium oxide ($TiO_2$), and zinc oxide (ZnO), or
a metal layer comprising any one or any combination of any two or more of aluminum (Al), nickel (Ni), platinum (Pt), gallium (Ga), and hafnium (Hf).

10. The bulk acoustic resonator of claim 9, further comprising:
a lower electrode disposed on the membrane layer;
a piezoelectric layer configured to partially cover the lower electrode; and
an upper electrode disposed on the piezoelectric layer.

11. The bulk acoustic resonator of claim 10, further comprising:
a passivation layer disposed on portions of the upper and lower electrodes; and
a metal pad disposed on other portions of the upper and lower electrodes on which the passivation layer is not formed.

12. The bulk acoustic resonator of claim 11, wherein a thickness deviation of either one or both of the substrate protection layer and the membrane layer is 170 Å or less.

13. The bulk acoustic resonator of claim 9, wherein the membrane layer comprises the dielectric layer, and the substrate protection layer comprises either one of silicon nitride and silicon oxide.

14. The bulk acoustic resonator of claim 9, wherein the substrate protection layer comprises the dielectric layer, and the membrane layer comprises either one of silicon nitride and silicon oxide.

15. The bulk acoustic resonator of claim 9, wherein a ratio of half a width of the active region of the bulk acoustic resonator to a thickness deviation of either one or both of the substrate protection layer and the membrane layer is greater than 0.0150 and less than 0.0200.

16. A filter, comprising:
bulk acoustic resonators,
wherein each of the bulk acoustic resonators comprises
a substrate comprising an upper surface on which a substrate protection layer is disposed, and
a membrane layer forming a cavity together with the substrate,
wherein a thickness of either one or both of the substrate protection layer and the membrane layer is greater at a center of an active region of the bulk acoustic resonator than at an edge of the active region,
wherein a thickness deviation of either one or both of the substrate protection layer and the membrane layer is 170 Å or less, and
wherein the bulk acoustic resonators are connected to each other in series or in parallel.

17. A bulk acoustic resonator, comprising:
a substrate comprising an upper surface on which a substrate protection layer is disposed; and
a membrane layer forming a cavity together with the substrate,
wherein a ratio of half a width of an active region of the bulk acoustic resonator to a thickness deviation of either one or both of the substrate protection layer and the membrane layer is greater than 0.0150 and less than 0.0200.

* * * * *